US011309021B2

(12) United States Patent
Amato et al.

(10) Patent No.: US 11,309,021 B2
(45) Date of Patent: Apr. 19, 2022

(54) SYSTEMS AND METHODS FOR STABILIZING CELL THRESHOLD VOLTAGE

(71) Applicant: Micron Technology, Inc., Boise, ID (US)

(72) Inventors: Paolo Amato, Treviglio (IT); Marco Sforzin, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 16/760,420

(22) PCT Filed: Dec. 3, 2019

(86) PCT No.: PCT/IB2019/001201
§ 371 (c)(1),
(2) Date: Apr. 29, 2020

(87) PCT Pub. No.: WO2021/111155
PCT Pub. Date: Jun. 10, 2021

(65) Prior Publication Data
US 2021/0407591 A1    Dec. 30, 2021

(51) Int. Cl.
*G11C 11/00* (2006.01)
*G11C 13/00* (2006.01)

(52) U.S. Cl.
CPC ...... *G11C 13/0023* (2013.01); *G11C 13/0069* (2013.01); *G11C 13/0004* (2013.01); *G11C 2013/0078* (2013.01); *G11C 2013/0092* (2013.01)

(58) Field of Classification Search
CPC ............ G11C 13/0023; G11C 13/0069; G11C 13/0004; G11C 13/0078
USPC .......................................................... 365/148
See application file for complete search history.

(56) References Cited

U.S. PATENT DOCUMENTS

| 6,014,330 A | 1/2000 | Endoh et al. |
|---|---|---|
| 7,936,610 B1 | 5/2011 | Melcher et al. |
| 10,089,170 B1* | 10/2018 | Goss ................... G06F 11/0793 |
| 2009/0273981 A1 | 11/2009 | Moschiano et al. |
| 2010/0259994 A1 | 10/2010 | Terauchi |
| 2015/0055409 A1 | 2/2015 | Karpov et al. |

OTHER PUBLICATIONS

International Search Report and Written Opinion, PCT/IB2019/001201, dated Aug. 28, 2020.

\* cited by examiner

*Primary Examiner* — Vu A Le
(74) *Attorney, Agent, or Firm* — Greenberg Traurig

(57) ABSTRACT

The present disclosure relates to a memory device comprising a plurality of memory cells, each memory cell being programmable to a logic state corresponding to a threshold voltage exhibited by the memory cell in response to an applied voltage, and a logic circuit portion operatively coupled to the plurality of memory cells, wherein the logic circuit portion is configured to scan memory addresses of the memory device, and to generate seasoning pulses to be applied to the addressed pages of the memory device. A related electronic system and related methods are also disclosed.

29 Claims, 7 Drawing Sheets

SYSTEMS AND METHODS FOR STABILIZING CELL THRESHOLD VOLTAGE

The present application is a national phase application under 35 U.S.C. § 371 of International Patent Application PCT/IB2019/001201, filed on Dec. 3, 2019, the entire disclosure of which application is hereby incorporated herein by reference.

TECHNICAL FIELD

The present disclosure relates to systems and methods for stabilizing cell threshold voltage, and more particularly to systems and methods for stabilizing cell threshold voltage during first set-reset cycles.

BACKGROUND

Memory devices comprise a plurality of memory cells adapted to store data in the form of programmable logic states. For example, binary memory cells can be programmed into two different logic states, often denoted by a logic "1" (also referred to as "SET" state) or a logic "0" (also referred to as "RESET" state). To access the stored data, a dedicated circuit may read or sense the stored logic state in the memory device. To store data, a dedicated circuit may write or program the logic state in the memory device.

Memory devices are used in many electronic systems such as mobile phones, personal digital assistants, laptop computers, digital cameras and the like. Nonvolatile memories retain their contents when power is switched off (i.e. the memory cells are capable of retaining the stored data by maintaining their programmed logic state for extended periods of time even in the absence of an external power source), making them good choices in memory devices for storing information that is to be retrieved after a system power-cycle. Several kinds of non-volatile memory devices are known in the art, a non-exhaustive list thereof comprising read-only memory devices, flash memory devices, ferroelectric Random Access Memory (RAM) devices, magnetic memory storage devices (such as for example hard disk drives), optical memory devices (such as for example CD-ROM disks, DVD-ROM disks, Blu-ray disks), Phase Change Memory (PCM) devices.

It is important to improve as much as possible the stability of the threshold voltages of the memory cells. There are many cell voltage stabilization techniques, which involve the execution of a seasoning process that ages the cell at a sufficient level. This process requires the use of a test machine interacting with the device. It is thus desirable having cost effective, time saving, efficient systems and methods for stabilization of cell threshold voltage without requiring any external test machine.

DETAILED DESCRIPTION

With reference to those drawings, systems and methods for an improved stabilization of cell threshold voltage will be disclosed herein.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines.

Figure 1:
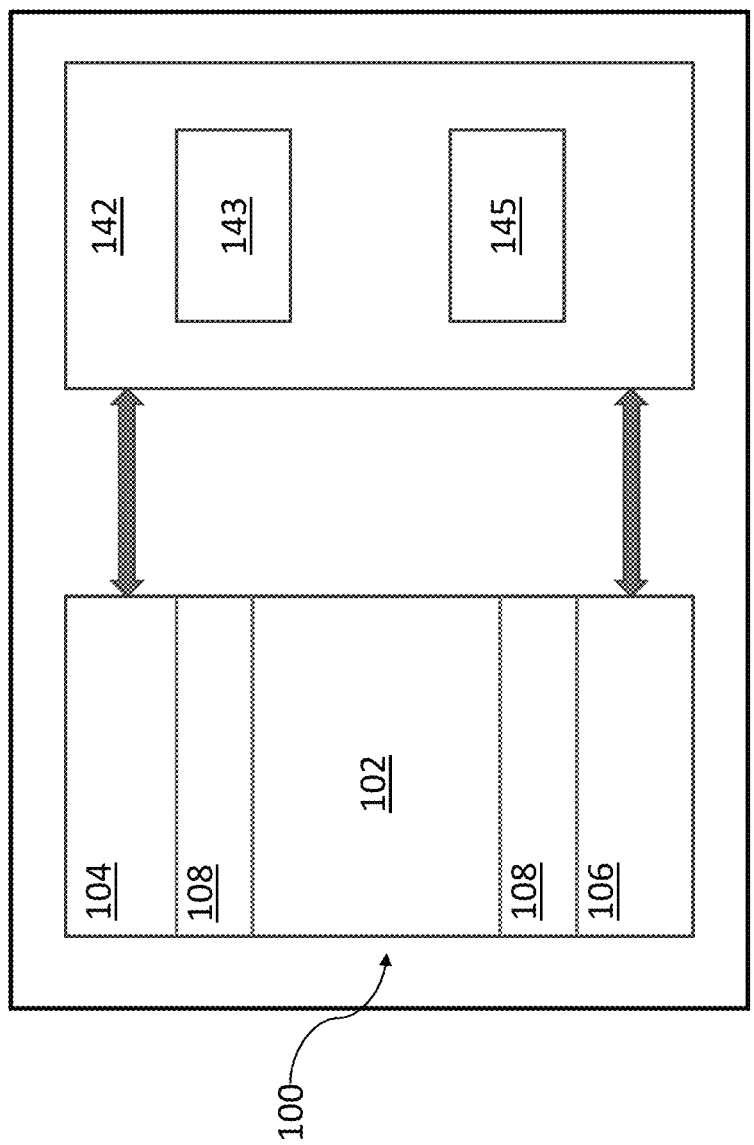
FIG. 1 is a block scheme illustrating an exemplary memory cell.

FIG. 1 illustrates a block scheme of an exemplary memory cell 100 whose threshold voltage can be stabilized according to the present disclosure.

In the embodiment illustrated in FIG. 1, the memory cell 100 includes a storage material 102 between access lines 104 and 106. The access lines 104, 106 electrically couple the memory cell 100 with circuitry 142 that writes to and reads the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100 may further include a selection device (not shown) between access lines 104 and 106; the selection device may be serially coupled to the storage material 200. In another embodiment, the storage material 102 is not a phase change material. In one embodiment in which the storage material 102 is not a phase change material, the storage material is capable of switching between two or more stable states without changing phase. The access circuitry 143 is able to program the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As mentioned above, the access lines 104, 106 electrically couple the memory cell 100 with circuitry 142. The access lines 104, 106 can be referred to as a bitline and wordline, respectively. The wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be composed of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including RuO2, or other suitable conductive materials. In one embodiment, conductive wordline layer can include any suitable metal including, for example, metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN, or another suitable electrically conductive material.

Referring again to the circuitry 142, the access lines 104, 106 communicatively couple the circuitry 142 to the memory cell 100, in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100. The terms "write" and "program" are used interchangeably to describe the act of storing information in a memory cell. To write to the memory cell 100, the access circuitry applies a voltage pulse with a particular magnitude and polarity to the access lines 104, 106, which can both select memory cell 100 and program memory cell 100.

For example, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence.

The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

The memory cell 100 is one example of a memory cell. Other embodiments can include memory cells having additional or different layers of material than illustrated in FIG. 1 (e.g., a thin dielectric material between the storage material and access lines).

Figure 2:
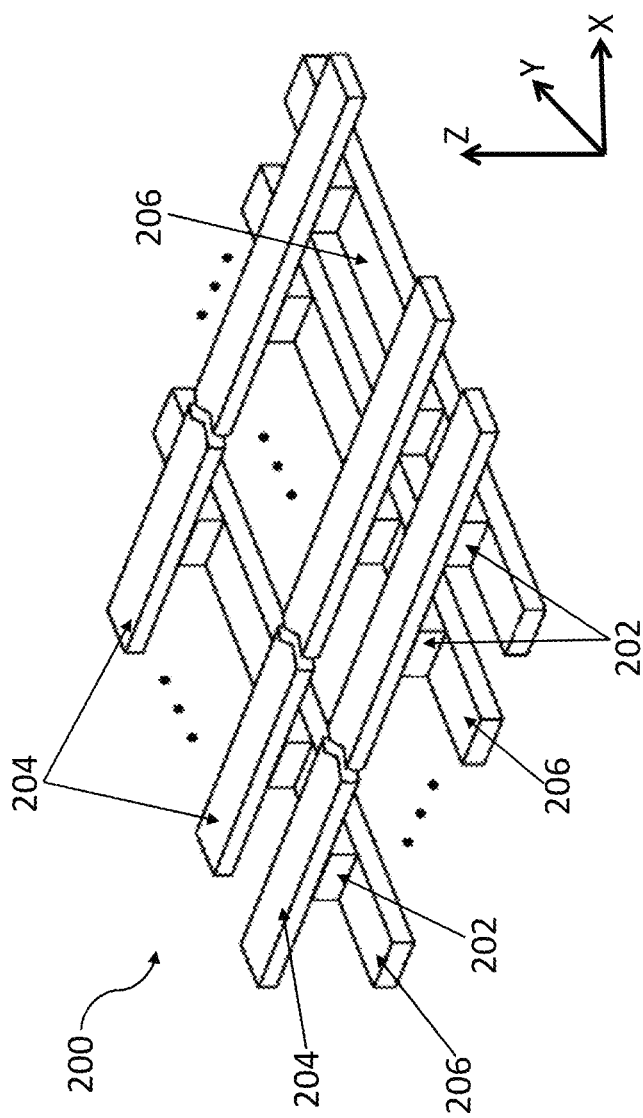
FIG. 2 schematically illustrates a portion of an exemplary memory cell array.

FIG. 2 shows a portion of a memory cell array 200, which can include a memory cell such as the memory cell 100 of FIG. 1, in accordance with an embodiment. Memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. Storage material 202 may be a self-selecting storage material, in some examples; storage material 202 may be serially coupled to a selection device (not shown), in other examples. In one embodiment, a "cross-point" is formed at an intersection between a bitline, a wordline. A memory cell is created from the storage material 202 between the bitline and wordline where the bitline and wordline intersect. The storage material 202 can be a chalcogenide material such as the storage material 102 described above with respect to FIG. 1. In one embodiment, the access lines 204, 206 are composed of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction). Generally speaking, the intersection defines the address of the memory cell.

FIGS. 1 and 2 illustrate an example of a memory cell and array. However, other memory cell structures and arrays may be used, in which the memory cells exhibit peculiar electrical responses, i.e. peculiar threshold voltages.

As stated above, a memory material, such as phase-change material, may exhibit different electric resistivity values depending on its phase, said resistivity values being associated to corresponding different logic states. For example, the resistivity of a phase-change material in the amorphous phase is higher than the resistivity of such material in the crystalline phase. Different degrees of partial crystallization can also be possible, having intermediate resistivity values between the one of the (fully) amorphous phase and the one of the (fully) crystalline phase.

Ideally, all memory cells of a memory device should feature a same (nominal) resistivity and therefore a same threshold voltage for a same logic state, wherein the threshold voltage is the voltage to be applied to the memory cells for causing them to conduct an electric current, i.e. the minimum value of the voltage that is needed to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess to which threshold voltage distribution the threshold voltage of the cell belongs. For example, a reading voltage may be applied to the cell and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a word line terminal, to a negative voltage (e.g. a selection voltage), and the other terminal, such as a bit line terminal, to a positive voltage (e.g. a reading voltage). Other biasing configurations may produce the same effects (e.g., both the word line and the bit line terminal biased to positive voltage, or the word line terminal biased to a reference voltage, e.g. a ground voltage, and the bit line terminal biased to a positive voltage).

Figure 3:
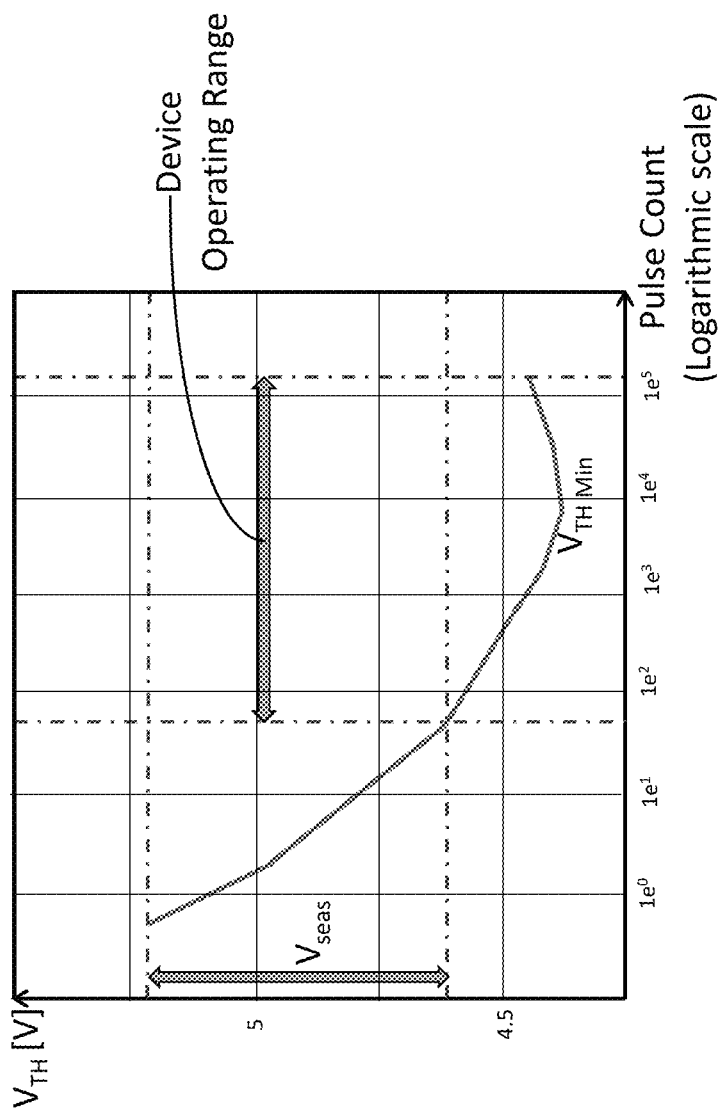
FIG. 3 is a graph illustrating threshold voltage values versus the number of set-reset cycles applied to an exemplary memory cell.

It is known that the cell threshold voltage for a given logic state rapidly decreases in the first set-reset cycles, becoming stable into an acceptable range after a determined number of applied cycles, as shown in FIG. 3 which is a schematic graph illustrating threshold voltage values versus the number of set-reset cycles applied to an exemplary memory cell.

Generally, cell threshold voltage stabilization techniques involve the execution of a seasoning process (i.e. the application of seasoning pulses to the cell) that ages the cell at a sufficient level. More in particular, the seasoning process performs cycling of the cells of the array in order to make the threshold voltage thereof stable into an acceptable range. According to known solutions, such seasoning process is performed in test mode, wherein a test machine interacts with a memory device by providing the addresses of the pages to season. In this case, the test machine controls the memory device for all the seasoning time, which can be very large. This leads to higher costs, poor efficiency and delay in performing the stabilization of cell threshold voltage.

As stated above in relation to FIG. 3, the threshold voltage $V_{TH}$ of a cell rapidly decreases after the first set-reset cycles. After a number of set-reset cycles, the threshold voltage $V_{TH}$ variation is contained into an acceptable range, so that the threshold voltage variations are manageable in the operational phase of the device. Generally, for feasibility reasons, pulses can be dispensed to the pages of the device according to a given sequence, e.g. every given number of nanoseconds. Moreover, the number of seasoning pulses a cell needs to stabilize its threshold voltage can be in the order of hundreds, so that the seasoning time can be very long. Test machine is thus applied to the memory device for all this long seasoning time. This drawback is overcome by the systems and methods of the present disclosure.

Figure 4:
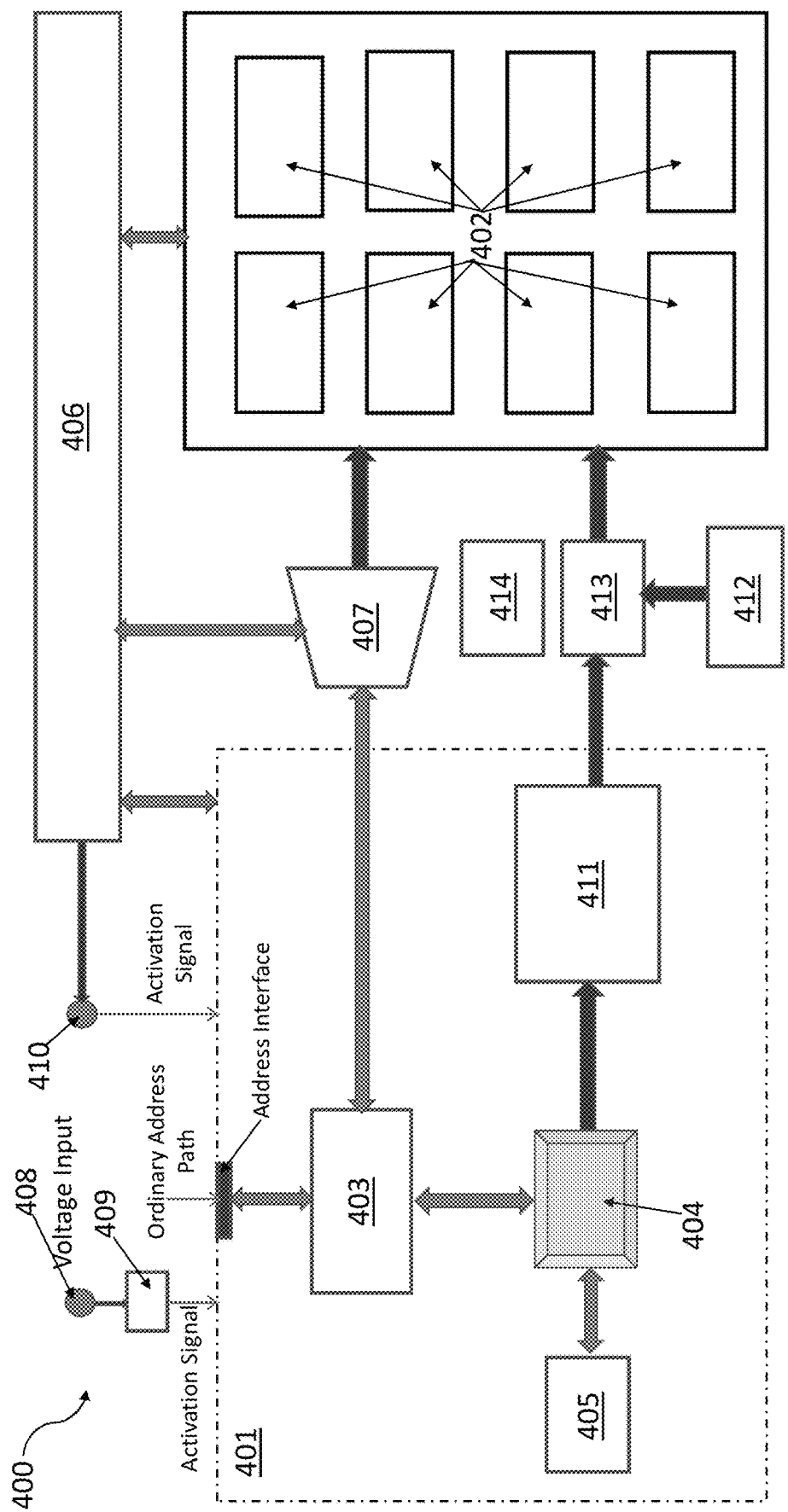
FIG. 4 is an exemplary a block scheme of a memory device including a logic circuit portion for stabilization of cell threshold voltage according to the present disclosure.

According to the present disclosure, an autonomous seasoning system and method for the stabilization of cell threshold voltage during first set-reset cycles is implemented by a dedicated logic circuit portion of a memory device, as shown in FIG. 4. Advantageously, the memory device is able to perform seasoning, and therefore to perform the stabilization of the cell threshold voltages, without the control or the involvement of an external test machine.

Referring to FIG. 4, the memory device 400 comprises a control logic or logic circuit portion 401 which is able to perform the seasoning process in an autonomous way. The logic circuit portion 401 is able to scan all the addresses of the memory device 400, apply a seasoning pulse to the addressed page, and then repeat the full scan of the device for an appropriate number of times so as to obtain the proper stabilization of the cell threshold voltage. In an embodiment, during the autonomous seasoning process, the memory device is set in busy state and does not perform any other activity.

More in particular, as shown in FIG. 4, the memory device 400 comprises a plurality of memory cells 402, each memory cell being programmable to at least two logic states, each logic state corresponding to a respective threshold voltage exhibited by the memory cell in response to an applied voltage. The memory cells 402 can be analogous to the cell disclosed in FIG. 1 or to the cells of FIG. 2.

The logic circuit portion 401 is operatively coupled to the plurality of memory cells 402 and is configured to scan the memory addresses of the memory device 400, as well as to generate seasoning pulses to be applied to the addressed pages. In an embodiment, the seasoning pulses are applied according to a given sequence comprising a pre-set number of pulses, as explained further below.

According to the present disclosure, the memory device 400 is thus able to autonomously perform the pre-conditioning of the memory cells 402 in order to stabilize the threshold voltages thereof without requiring an external test machine, thanks to the presence of the logic circuit portion 401, which is able to provide the addresses (or a subset of the addresses) of the pages to season and to generate the proper seasoning pulses to be applied to the addressed pages.

At this purpose, the logic circuit portion 401 comprises a counter 403 configured to scan the memory addresses of the memory device 400. The memory device 400 also comprises a managing unit 404 which is operatively coupled to the counter 403.

The managing unit 404 is configured to manage the operation of the logic circuit portion 401, in particular to manage the generation and the application of the seasoning pulses to the addressed page.

According to the present disclosure, the generation and application of the seasoning pulse is repeated according to a determined pulse sequence, wherein the applied pulse sequence comprises a pre-set number of seasoning pulses, said pre-set number being stored in the logic circuit portion 401 of the memory device 400. Therefore, the logic circuit portion 401, besides scanning the memory address and generating a pulse to be applied to the addressed pages, is configured to generate a proper command to repeat the application of the seasoning pulses to the addressed pages for a proper number of times.

In an embodiment, the seasoning pulses can be designed to accelerate seasoning process thereby reducing the overall seasoning time. Furthermore, pulses can be distributed or supplied to the pages of the memory device every certain number of nanoseconds, e.g. every 100-200 ns.

According to an embodiment of the present disclosure, the logic circuit portion 401 is configured to generate seasoning pulses having a longer duration than programming pulses for the memory cells. In this case, the seasoning pulse is essentially an enlarged reset pulse. In other words, according to the present disclosure, the "seasoning pulse" is an initial pulse applied to the cell, which pulse can be longer than subsequent programming pulses, the purpose of such seasoning pulse being to adjust to a stable value the resistance, and thus the threshold voltage, of the cell.

The embodiments of the present disclosure thus provide an autonomous, low-cost, effective and reliable seasoning system for the stabilization of cell threshold voltage during first set-reset cycles, without the use of a test machine to control the device for all the seasoning time. Such autonomous seasoning is designed to accelerate the seasoning process thereby reducing the overall seasoning time.

According to an embodiment of the present disclosure, the logic circuit portion 401 comprises a further counter 405 adapted to count the number of applied seasoning pulses. The managing unit 404 of the logic circuit portion 401 is then adapted to compare the counted pulses with the stored pre-set number, and to stop the application of the seasoning pulses when the number of applied pulses is equal to the pre-set number. In an embodiment, the pre-set number is stored in the managing unit 404.

In one embodiment, the memory device 400 is configured to be set in busy state during the application of the seasoning pulses, so that it cannot perform any other activity. In this case, only the circuit logic portion 401 of the memory device 400 is operated to perform the autonomous seasoning.

In one embodiment, the logic circuit portion 401 is configured to start the seasoning procedure in response to receiving a specific command or a specific sequence of signals applied to input/output pads thereof, or also in response to a specific supply voltage different from the spec voltage, i.e. different from the nominal supply voltage. In one embodiment, after the launching of the autonomous seasoning process, the only need for the device is to have the supply voltage.

For example, the memory device 400 may receive at a voltage input 408 thereof a supply voltage, and then a dedicated circuit 409 is configured to assess whether the applied supply voltage is greater than the nominal supply voltage needed for the standard operation of the device. If the applied supply voltage is greater than the nominal supply voltage, the circuit 409 generates an activation signal that is sent to the logic circuit portion 401 to start the seasoning procedure. In another embodiment, the memory device 400 comprises at least one dedicated pad 410 structured to receive a command (for example from a controller) for the execution of the seasoning process.

Generally, the memory device is subjected to different seasoning events during the manufacturing thereof. More in particular, the seasoning process can be performed at wafer level, at unit level after assembly and bonding, and possibly at unit level in quality test. All these seasoning events are usually performed by the manufacturer during the manufacturing steps of the device, for example at wafer level testing/sorting.

Moreover, according to the present disclosure, the seasoning process can be performed autonomously at unit level also after soldering, i.e. it can be autonomously performed also at customer level. In any case, as mentioned before, the autonomous seasoning process can be easily launched by a specific command applied to pads of the device or by a specific supply voltage. After the launching of the autonomous seasoning process according to the present disclosure, the memory device is able to perform it without an external test machine, only the supply voltage has to be delivered to the device. In fact, advantageously according to the present disclosure, the memory device 400 includes the logic circuit portion 401 having components suitably structured and configured to perform the autonomous seasoning.

In order to reduce as much as possible the seasoning process impact relatively to the last-mentioned seasoning event, i.e. relatively to the seasoning at unit level after soldering, a partial seasoning of the device may be executed in foreground with direct impact for the customer, in this way reducing said direct impact to the costumer.

More in particular, according to an embodiment of the present disclosure, the logic circuit portion is configured to apply the pre-set number of seasoning pulses to a selected portion of the memory cells (i.e. to a selected portion of the addressed pages) in a first seasoning process, and then to apply the pre-set number of seasoning pulses to a selected second portion of memory cells of the memory device in a second seasoning process. In some embodiments the selected second portion of memory cells comprises all the memory cells that are not in the selected portion (i.e. the second seasoning process is applied to the remaining addressed pages); in other embodiments, the seasoning process of the full device is completed in more than two steps (e.g., there may be additional seasoning processes after the first and the second seasoning processes).

In other words, a seasoning process may be operated for just a portion of the memory device 400. For example, in case the memory device 400 is used in mobile applications (e.g. it is embedded in a mobile phone), the selected portion of the memory device comprises a portion of Source Measurement Unit (SMU), and also a portion of Line Monitor Unit (LMU). This reduces as much as possible the customer impact. After the first seasoning process in foreground, the seasoning is then completed in background once the device starts working in the application, thus reducing testing costs and the impact on customer, the background-seasoning impact being negligible to the user.

Furthermore, according to another embodiment of the present disclosure, the logic circuit portion may be configured to apply only a first number of seasoning pulses to all the addressed pages of the memory device in a first seasoning process, i.e. in foreground, and then to apply subsequent seasoning pulses (to all the addressed pages of the memory device in a second seasoning process, i.e. in background. For example, an additional second number of seasoning pulses may be applied during the second seasoning process; in some cases the total number of (first plus second) pulses equals the pre-set number of seasoning pulses) In this case, only a certain number of pulses are applied in a first time, so as to move the threshold voltage close to the device operating range as shown in the graph of FIG. 3, and then the application of the remaining pulses is done in a second moment.

As shown in FIG. 4, the memory device 400 comprises a controller 406, which can include an embedded firmware and is adapted to manage and control the operation of the overall memory device 400. In an embodiment, the controller is configured to generate access commands, the memory controller 406 being coupled to the plurality of memory cells 402 and configured to apply a reading voltage to memory cells during a reading operation to assess the logic state thereof. According to an embodiment, the controller 406 is responsible for interfacing the memory device 400 with a host and for programming the memory cells.

The memory device 400 can also comprise other components, such as processor units coupled to the controller 406, antennas, connection means (not shown) with a host device, and the like.

Even if FIG. 4 shows a controller 406 separated from the logic circuit portion 401, according to an embodiment the logic circuit portion 401 may be embedded in the controller 406.

Moreover, according to an embodiment of the present disclosure, the logic circuit portion 401 is coupled to a decoder 407 via the counter 403, the decoder 407 permitting the access to the memory cells 402.

The access to the memory cells 402 is therefore controlled through the decoder 407. The decoder 407 may comprise a row decoder receiving a row address and energizing a corresponding word line according to the received row address. Similarly, decoder 407 may comprise a column decoder receiving a column address and accordingly energizing a corresponding set of bit lines.

According to an embodiment, the decoder 407 receives the addresses from the counter 403, which in turn scans all the address of the memory device 400 via an address interface connected to the ordinary address path. Upon accessing the memory cells 402, a voltage may be applied using the corresponding word lines and bit lines.

The seasoning pulse is generated by a seasoning pulse generation unit 411 of the logic circuit portion 401. The generated seasoning pulse is then applied to the corresponding addressed pages provided by the counter 403 connected to the decoder 407.

As previously mentioned, according to an embodiment, the seasoning pulse differs from a standard reset pulse (which is generated by a pulse generation unit 412 of the memory device) in that the former has a longer duration (in the order of one hundred ns) and may have a similar voltage. At this purpose, in one embodiment, the memory device may be provided with a timing unit 414 (which may be embedded in the logic control circuit 401, even if other architectures are possible), providing the proper timing of the generated pulses. The timing unit may be connected with the pulse generation units.

The manging unit 404 is therefore in operative connection with the seasoning pulse generation unit 411 for the generation and application of said seasoning pulses to the memory cells 402. In one embodiment, a multiplexer 413 may receive at its inputs the pulses generated by units 411 and 412 and may be configured to deliver said pulses to the memory cells 402.

Figure 5:
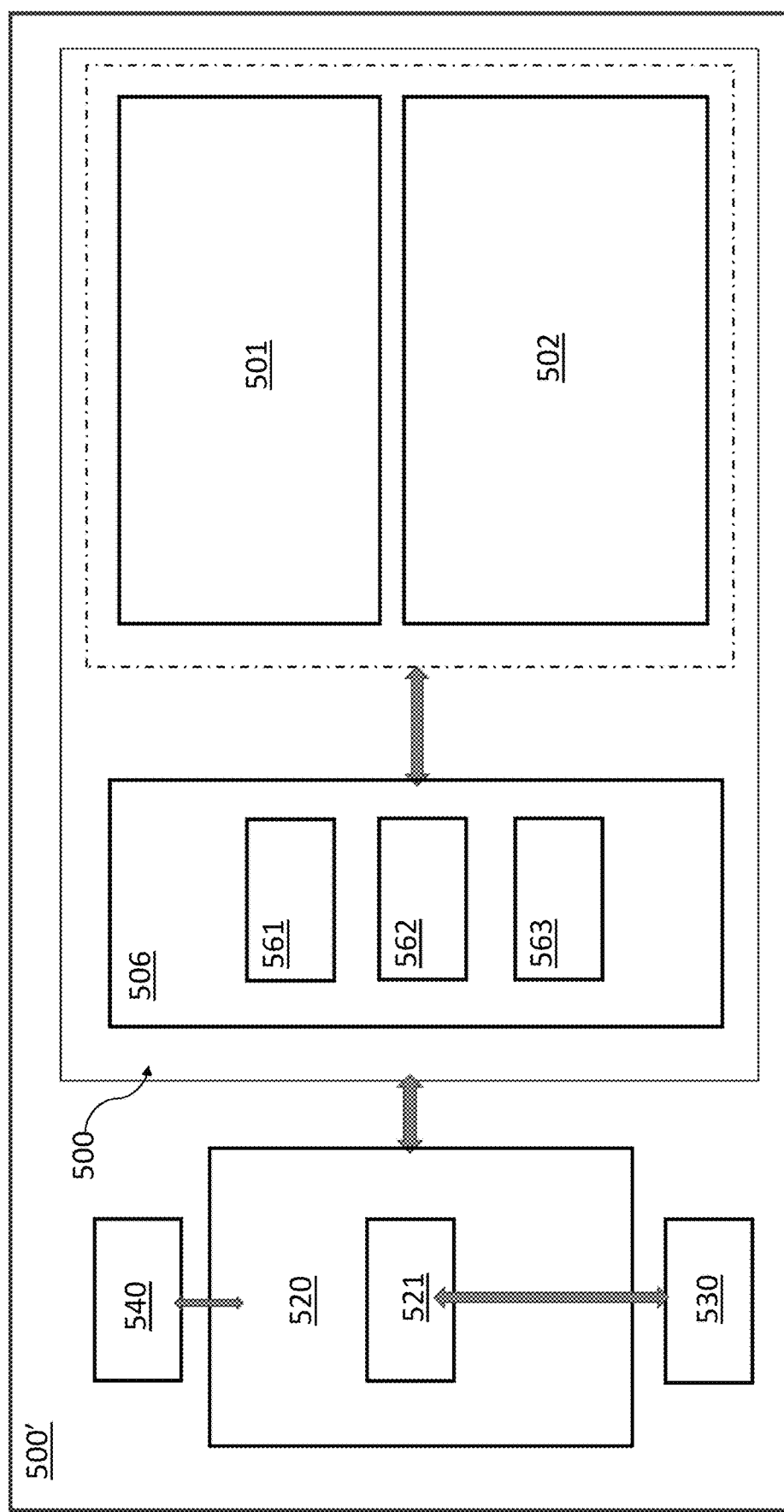
FIG. 5 shows a schematic block diagram of a system including a memory device according to the disclosure.

FIG. 5 is a high-level scheme of an electronic system 500' that can perform the autonomous seasoning according to the present disclosure. The system 500' includes a memory device 500, in turn including an array of memory cells 502 and a logic circuit portion 501 operatively coupled to the memory cells 502; the memory device 500, the logic circuit portion 501 and the memory cells 502 of FIG. 5 may correspond to the memory device 400, the logic circuit portion 401 and the memory cells 402 of FIG. 4, respectively.

The memory device 500 comprises a memory controller 506 (corresponding to the controller 406 of FIG. 4), which represents control logic that generates memory access commands, for example in response to command by a host 520. The memory controller 506 accesses the memory cells 502. In one embodiment, the memory controller 506, which is operatively coupled with a host processor 521, can also be implemented in the host 520, in particular as part of the host processor 521, even if the present disclosure is not limited by a particular architecture.

Multiple signal lines couple the memory controller 506 with the memory cells 502 and with the logic circuit portion 501. For example, such signal lines may include clock, command/address and write data (DQ), read DQ, and zero or more other signal lines. The memory controller 506 is thus operatively coupled via suitable buses to the memory portion of the device.

The memory cells 502 represent the memory resource for the system 500'. In one embodiment, the array of memory cells 502 is managed as rows of data, accessed via wordline (rows) and bitline (individual bits within a row) control. In one embodiment, the array 502 of memory cells includes a 3D crosspoint array such as the memory cell array 200 of FIG. 2. The array 502 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 506 includes refresh (REF) logic 561. In one embodiment, refresh logic 561 indicates a location for refresh, and a type of refresh to perform. Refresh logic 561 can trigger self-refresh within memory, and issue external refreshes by sending refresh commands to trigger the execution of a refresh operation.

In the exemplary embodiment illustrated in FIG. 5, the memory controller 506 also includes error detection/correction circuitry 562. The error detection/correction circuitry 562 can include hardware logic to implement an error correction code (ECC) to detect errors occurring in data read from memory portion. In one embodiment, error detection/correction circuitry 562 also corrects errors (up to a certain error rate based on the implemented ECC code). However, in other embodiments, error detection/correction circuitry 562 only detects but does not correct errors.

In the illustrated embodiment, the memory controller 506 includes command (CMD) logic 563, which represents logic or circuitry to generate commands to send to logic circuit portion 501 and to the memory cells 502. Clearly, also other architectures can be employed.

The memory device 500 is operatively coupled with the host device 520, for example via the controller 506. The host device 520 represents a computing device in accordance with any embodiment described herein, and can be a laptop computer, a desktop computer, a server, a gaming or entertainment control system, a scanner, copier, printer, routing or switching device, embedded computing device, or other electronic device such as a smartphone. In a preferred embodiment of the present disclosure, the host 520 is a mobile phone. The memory device 500 may also be embedded in the host device 520.

In one embodiment, the system 500' includes an interface 530 coupled to the processor 521, which can represent a high speed interface or a high throughput interface for system components that needs higher bandwidth connections, and/or graphics interface components. Graphics interface interfaces to graphics components for providing a visual display to a user of system 500. In one embodiment, graphics interface generates a display based on data stored in the memory device or based on operations executed by processor or both. The system 500' may also comprise network interface 540 communicatively coupled to the host or to memory device for example for connecting with other systems, and/or a battery coupled to provide power to said system. In other words, the system 500' may further comprise a communication module is configured to enable communications with other electronic systems, and/or interface devices configured to enable interface of a user As mentioned above, in one embodiment, the logic circuit portion 501 is configured to apply the pre-set number of seasoning pulses to a selected portion of the addressed pages of the memory device in foreground during operation of the processor, and then to apply the pre-set number of seasoning pulses to a selected second portion of addressed pages of the memory device in background during operation of the processor. In some embodiments the selected second portion of memory cells comprises all the pages that are not in the first selected portion (i.e. the second seasoning process is applied to the remaining addressed pages); in other embodiments, the seasoning process of the full device is completed in background in more than two steps (e.g., there may be a number of partial seasoning processes after the first and the second seasoning processes). These embodiments, providing a partial seasoning of the device in foreground, helps in reducing as much as possible the seasoning process impact on the customer.

For example, in mobile applications, the selected portion of the memory device comprises a portion of Source Measurement Unit (SMU) and a portion of Line Monitor Unit (LMU).

In another embodiment, the logic circuit portion is configured to apply a first number of the seasoning pulses to all the addressed pages of the memory device in foreground during operation of the processor, and then to apply subsequent seasoning pulses to all the addressed pages of the memory device in background during operation of the processor. For example, an additional second number of seasoning pulses may be applied during the second seasoning process; in some cases, the total number of (first plus second) pulses equals the pre-set number of seasoning pulses. In this case, only a certain number of pulses are applied in a during the first seasoning process, and the application of the remaining pulses is done during a second seasoning process (however, additional subsequent seasoning processes may be conceived; e.g., the complete process may be split in two or more sub-processes).

The present disclosure also refers to a method for stabilizing the threshold voltages of a plurality of memory cells comprised in a memory device, each memory cell being programmable to a logic state, each logic state corresponding to a respective threshold voltage exhibited by the memory cell in response to an applied voltage.

Figure 6:
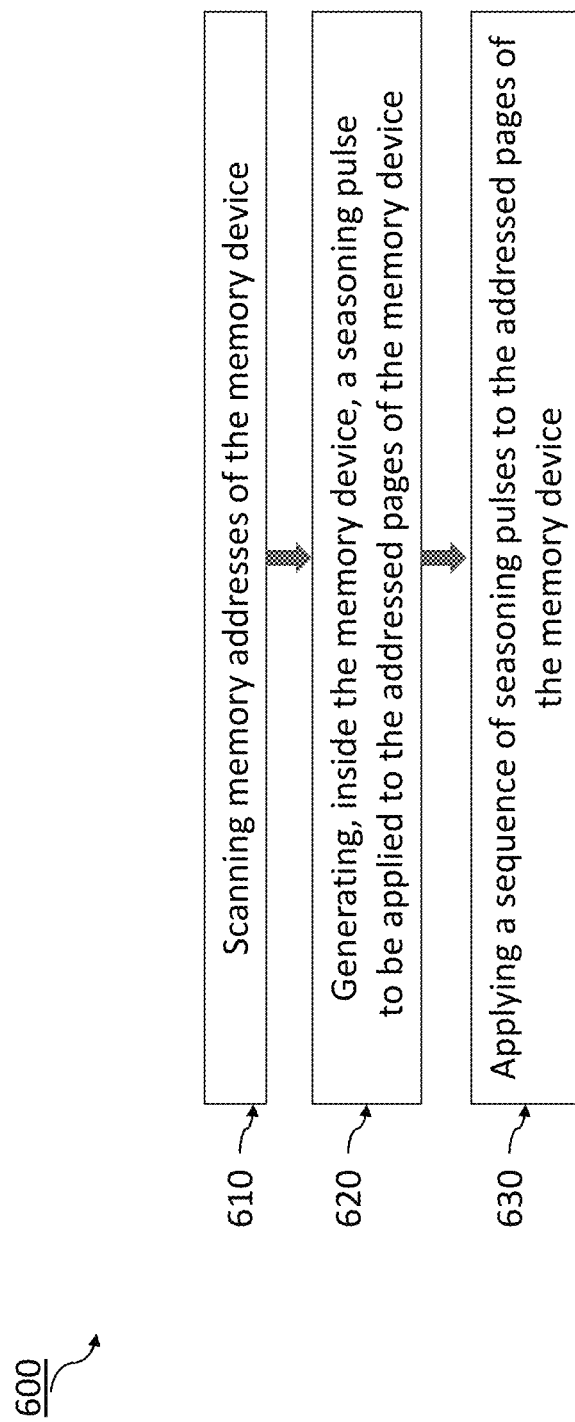
FIG. 6 is a flow diagram representing steps of a method according to the present disclosure.

FIG. 6 *s* is a flow diagram representing steps of the method 600 according to the present disclosure. As shown in FIG. 6, the method comprises a first step 610 of scanning memory addresses associated to the memory cells of the memory device, this step being performed using counter internal to the memory device, such as the counter 403 of FIG. 4.

The method then comprises a step 620 of generating, by a dedicated circuitry inside the memory device, seasoning pulses to be applied to addressed pages of the memory device. The dedicated circuitry may be for example the logic circuit portion 401 of FIG. 4 or 501 of FIG. 5.

Method 600, at step 630, provides for applying a sequence of seasoning pulses to the addressed pages of the memory device, so as to obtain the desired stabilization of cell threshold voltages without requiring the use of an external test machine.

More in particular, according to an embodiment of the present disclosure, the application of the sequence of seasoning pulses comprises applying a pre-set number of seasoning pulses that corresponds to the number needed to stabilize the threshold voltages in an acceptable operating range, i.e. in a range in which the variation of the threshold voltages are negligible.

The actual number of applied pulses is then compared the pre-set number of seasoning pulses, so that the application is stopped once the number of applied pulses is equal to the pre-set threshold number.

According to an embodiment of the present disclosure, the application of the sequence of seasoning pulses comprises applying the pre-set number of seasoning pulses to a selected portion of the addressed pages in a first seasoning process, and then a second step of applying the sequence of seasoning pulses to a second selected portion of the addressed pages in a second seasoning process.

In another embodiment, the method comprises a first step of applying a first number of the seasoning pulses to all the addressed pages in a first seasoning process, and then a second step of applying subsequent seasoning pulses to all the addressed pages in a second seasoning process.

According to an embodiment, the seasoning pulse has longer pulse duration than programming pulses used to program the memory cells.

Figure 7:
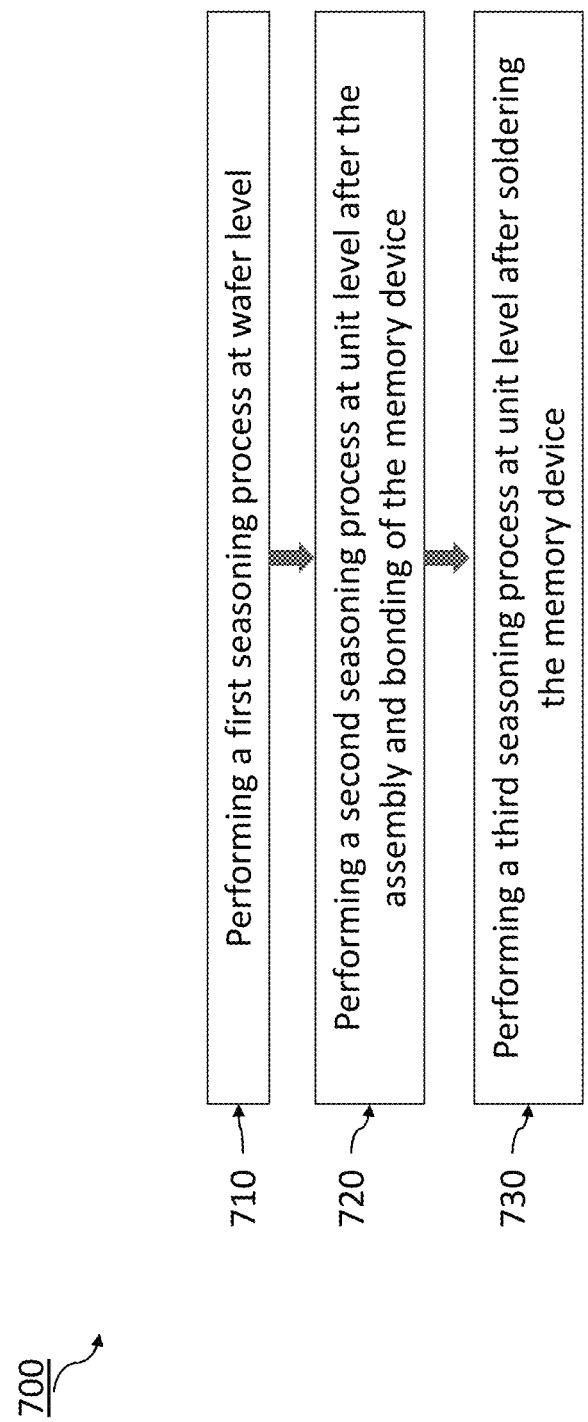
FIG. 7 is a flow diagram representing steps of a method according to an embodiment of the present disclosure.

As above mentioned, a device may be subjected to multiple seasoning events during the manufacturing and test thereof. For example, according to a method 700 illustrated in FIG. 7, at a first step 710, a first seasoning process at wafer level is performed. Then, at step 720, the method provides performing a second seasoning process at unit level after the assembly and bonding of the memory device. Finally, at step 730, the method provides performing a third seasoning process at unit level after soldering the memory device. One or more, or even all these seasoning procedures are autonomously performed by the dedicated logic circuitry of the present disclosure.

This has the advantage that, especially in the last step 730, the seasoning process can be autonomously performed also out of manufacturer at customer level, and the possibility of performing a partial seasoning reduces the seasoning impact for the costumer.

In conclusion, an autonomous seasoning system and method for stabilization of cell threshold voltage during first set-reset cycles (i.e. during first status change cycles) is disclosed herein. The seasoning process can be performed at wafer level, at unit level after assembly and bonding and at unit level in quality test. Moreover, advantageously according to the present disclosure, the seasoning process can be performed autonomously at unit level after soldering, i.e. it can be autonomously performed also out of manufacturer at customer level. The autonomous seasoning process can be launched by a specific command or a specific sequence of signals applied to input or output pads, and/or also by a specific supply voltage greater than the nominal supply voltage. After the launching of the autonomous seasoning method, the only requirement for the device is to have the supply voltages.

More in particular, an example memory device comprises a plurality of memory cells, each memory cell being programmable to a logic state corresponding to a threshold voltage exhibited by the memory cell in response to an applied voltage, as well as it comprises a logic circuit portion operatively coupled to the plurality of memory cells, wherein the logic circuit portion is configured to scan memory addresses of the memory device, and to generate seasoning pulses to be applied, for example according to a predetermined sequence, to the addressed pages of the memory device for the stabilization of the threshold voltage of the memory cells. An exemplary related electronic system and exemplary related methods are also disclosed.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is thus to be understood that the above description has been made in an illustrative fashion, and not a restrictive one. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein. The scope of one or more examples of the present disclosure should be determined with reference to the appended claims, along with the full range of equivalents to which such claims are entitled.

The invention claimed is:

1. A memory device comprising:
a plurality of memory cells, each memory cell being programmable to a logic state corresponding to a threshold voltage exhibited by the memory cell in response to an applied voltage; and
a logic circuit portion operatively coupled to the plurality of memory cells, wherein said logic circuit portion is configured to:
scan memory addresses of the memory device; and
generate seasoning pulses to be applied to addressed pages of the memory device for stabilization of the threshold voltage of the memory cells.

2. The memory device of claim 1, wherein the logic circuit portion comprises a counter configured to scan the memory addresses of the memory device, said counter being operatively coupled with a manging unit of the memory device for application of said seasoning pulses to the addressed pages.

3. The memory device of claim 1, wherein the logic circuit portion is configured so that a sequence comprising a pre-set number of seasoning pulses is applied to the memory cells.

4. The memory device of claim 3, wherein the logic circuit portion comprises a further counter adapted to count the number of applied seasoning pulses, and wherein said logic circuit portion is further configured to compare the counted pulses with the pre-set number.

5. The memory device of claim 1, wherein the logic circuit portion is configured to generate seasoning pulses having a longer duration than programming pulses for said memory cells.

6. The memory device of claim 1, wherein the logic circuit portion is configured to apply a pre-set number of seasoning pulses to a selected first portion of the addressed pages of the memory device in a first seasoning process, and then to apply the pre-set number of seasoning pulses to a selected second portion of addressed pages of the memory device in a second seasoning process.

7. The memory device of claim 1, wherein the logic circuit portion is configured to apply a first number of seasoning pulses to all the addressed pages of the memory device in a first seasoning process, and then to apply subsequent seasoning pulses to all the addressed pages of the memory device in a second seasoning process.

8. The memory device of claim 1, comprising a controller configured to generate access commands, said controller being coupled to the plurality of memory cells and configured to apply a reading voltage to memory cells during a reading operation to assess the logic state thereof.

9. The memory device according to claim 8, wherein the logic circuit portion is embedded in the controller and is operatively coupled to a decoder of the memory device.

10. The memory device of claim 1, wherein a memory portion comprises a 3D cross point memory.

11. The memory device of claim 1, wherein the logic circuit portion is configured to scan the memory addresses and to generate the seasoning pulses in response to receiving a specific command or a specific sequence of signals applied to input/output pads of the device, and/or in response to receiving a specific supply voltage different from a nominal supply voltage.

12. The memory device of claim 1, wherein said memory device is configured to be set in busy state during application of the seasoning pulses.

13. An electronic system comprising:
a host device including a processor module;
a memory device operatively coupled to the host device; and
a managing unit of the memory device, wherein the memory device comprises:
a plurality of memory cells, each memory cell being programmable to a logic state corresponding to a threshold voltage exhibited by the memory cell in response to an applied voltage; and
a logic circuit portion operatively coupled to the plurality of memory cells, wherein said logic circuit portion is configured to:
scan memory addresses of the memory device; and
generate seasoning pulses to be applied to addressed pages of the memory device for stabilization of the threshold voltage of the memory cells.

14. The electronic system of claim 13, wherein the logic circuit portion is configured to apply a pre-set number of seasoning pulses to a selected portion of the addressed pages of the memory device in foreground during operation of the processor, and then to apply the pre-set number of seasoning pulses to a selected second portion of addressed pages of the memory device in background during operation of the processor.

15. The electronic system of claim 14, wherein the host is a mobile phone, and wherein the selected portion of the memory device comprises a portion of Source Measurement Unit (SMU) and a portion of Line Monitor Unit (LMU).

16. The electronic system of claim 13, wherein the logic circuit portion is configured to apply a first number of the seasoning pulses to all the addressed pages of the memory device in foreground during operation of the processor, and then to apply subsequent seasoning pulses to all the addressed pages of the memory device in background during operation of the processor.

17. The electronic system of claim 13, comprising a counter configured to scan the memory addresses of the memory device, said counter being operatively coupled with the manging unit of the memory device for application of said seasoning pulses to the addressed pages.

18. The electronic system of claim 13, comprising a controller configured to generate access commands, said controller being in operative connection with the processor module.

19. The electronic system of claim 13, wherein the managing unit of the logic circuit portion is in operative connection with a seasoning pulse generation unit for generation and application of said seasoning pulses to the memory cells of the memory device.

20. The electronic system of claim 13, wherein the logic circuit portion is configured to scan the memory addresses and to generate the seasoning pulses upon receiving a specific command or a specific sequence of signals applied to input/output pads of the system, and/or upon receiving a specific supply voltage different from a nominal supply voltage.

21. The electronic system of claim 13, further comprising a communication module configured to enable communications with other electronic systems, and/or interface devices configured to enable interface of a user.

22. A method for stabilizing threshold voltages of a plurality of memory cells included in a memory device, each memory cell being programmable to a logic state corresponding to a threshold voltage exhibited by the memory cell in response to an applied voltage, the method comprising the steps of:
scanning memory addresses of the memory device, wherein said scanning is performed by a logic circuit portion internal to the memory device;
generating, inside the logic circuit portion of the memory device, a seasoning pulse to be applied to addressed pages of the memory device; and
applying a sequence of seasoning pulses to said addressed pages of the memory device.

23. The method of claim 22, wherein applying the sequence of seasoning pulses comprises applying a pre-set number of seasoning pulses that corresponds to a number required to stabilize the threshold voltages, the method further comprising a step of comparing the actual number of applied pulses to said pre-set number of seasoning pulses.

24. The method of claim 22, wherein applying a sequence of seasoning pulses involves applying a pulse of longer pulse duration than programming pulses used to program said cell.

25. The method of claim 22, wherein, during application of the seasoning pulses, a busy state is set and no other operation is performed.

26. The method of claim 22, comprising a first step of applying the sequence of seasoning pulses to a selected portion of the addressed pages in a first seasoning process, and then a second step of applying the sequence of seasoning pulses to a second selected portion of the addressed pages in a second seasoning process.

27. The method of claim 22, comprising a first step of applying a first number of the seasoning pulses to all the addressed pages in a first seasoning process, and then a second step of applying subsequent seasoning pulses to all the addressed pages in a second seasoning process.

28. The method of claim 22, wherein said steps are executed upon receiving a specific command or a specific sequence of signals, and/or upon receiving a specific supply voltage different from a nominal supply voltage.

29. A method for operating a memory device, comprising the steps of:
performing a first seasoning process at wafer level;
performing a second seasoning process at unit level after assembly and bonding of the memory device; and performing a third seasoning process at unit level after soldering the memory device, wherein at least one of the seasoning processes are performed autonomously according to claim 22.

* * * * *